United States Patent
Choi et al.

(10) Patent No.: US 8,372,205 B2
(45) Date of Patent: Feb. 12, 2013

(54) REDUCING ELECTROSTATIC CHARGE BY ROUGHENING THE SUSCEPTOR

(75) Inventors: Soo Young Choi, Fremont, CA (US); Beom Soo Park, San Jose, CA (US); Quanyuan Shang, Saratoga, CA (US); John M. White, Hayward, CA (US); Dong-Kil Yim, Sungnam (KR); Chung-Hee Park, Seoul (KR)

(73) Assignee: Applied Materials, Inc., Santa Clara, CA (US)

( * ) Notice: Subject to any disclaimer, the term of this patent is extended or adjusted under 35 U.S.C. 154(b) by 2019 days.

(21) Appl. No.: 11/182,168

(22) Filed: Jul. 15, 2005

(65) Prior Publication Data

US 2006/0032586 A1    Feb. 16, 2006

Related U.S. Application Data

(63) Continuation-in-part of application No. 10/435,182, filed on May 9, 2003, now abandoned.

(51) Int. Cl.
*H01L 21/306* (2006.01)
*C23C 16/00* (2006.01)
*C23F 1/00* (2006.01)

(52) U.S. Cl. ............... 118/728; 118/723 R; 156/345.51

(58) Field of Classification Search ............ 156/345.51; 118/723 R, 728
See application file for complete search history.

(56) References Cited

U.S. PATENT DOCUMENTS

| | | | |
|---|---|---|---|
| 4,801,785 A | 1/1989 | Chan et al. | |
| 4,974,369 A | 12/1990 | Dixon | |
| 5,104,514 A | 4/1992 | Quartarone | |
| 5,200,157 A * | 4/1993 | Toya et al. ............. | 118/730 |
| 5,384,682 A | 1/1995 | Watanabe et al. | |
| 5,581,874 A | 12/1996 | Aoki et al. | |
| 5,675,471 A | 10/1997 | Kotecki | |
| 5,844,205 A * | 12/1998 | White et al. .............. | 219/390 |
| 6,024,044 A | 2/2000 | Law et al. | |
| 6,055,927 A | 5/2000 | Shang et al. | |
| 6,063,203 A * | 5/2000 | Satoh ..................... | 118/728 |
| 6,064,031 A | 5/2000 | Talwar | |

(Continued)

FOREIGN PATENT DOCUMENTS

| | | |
|---|---|---|
| EP | 0 803 900 A2 | 10/1997 |
| EP | 1 193 751 B1 | 4/2002 |

(Continued)

OTHER PUBLICATIONS

Hawley's Condensed Chemical Dictionary, 14th ed. at http://www.knovel.com on Apr. 30, 2005.*

(Continued)

*Primary Examiner* — Karla Moore
*Assistant Examiner* — Nathan K Ford
(74) *Attorney, Agent, or Firm* — Patterson & Sheridan, LLP

(57) ABSTRACT

A substrate support and method for fabricating the same are provided. In one embodiment of the invention, a substrate support includes an electrically conductive body having a substrate support surface that is covered by an electrically insulative coating. At least a portion of the coating centered on the substrate support surface has a surface finish of between about 200 to about 2000 micro-inches. In another embodiment, a substrate support includes an anodized aluminum body having a surface finish on the portion of the body adapted to support a substrate thereon of between about 200 to about 2000 micro-inches. In one embodiment, a substrate support assembly includes an electrically conductive body having a substrate support surface, a substrate support structure that is adapted to support the conductive body and the conductive body is covered by an electrically insulative coating.

25 Claims, 6 Drawing Sheets

U.S. PATENT DOCUMENTS

| | | | |
|---|---|---|---|
| 6,159,301 | A | 12/2000 | Sato et al. |
| 6,196,001 | B1 | 3/2001 | Tannous et al. |
| 6,343,784 | B1 | 2/2002 | Jourde et al. |
| 6,423,175 | B1 | 7/2002 | Huang et al. |
| 6,510,888 | B1 | 1/2003 | Matsumura et al. |
| 6,554,907 | B2 | 4/2003 | Beer et al. |
| 6,841,049 | B2 * | 1/2005 | Ito et al. .................. 204/298.15 |
| 2002/0063108 | A1 | 5/2002 | Wang et al. |
| 2002/0176219 | A1 * | 11/2002 | Sakaue et al. ................ 361/234 |
| 2003/0010446 | A1 | 1/2003 | Kajiyama et al. |
| 2004/0221959 | A1 | 11/2004 | Choi et al. |

FOREIGN PATENT DOCUMENTS

| | | |
|---|---|---|
| JP | 03148872 A | 6/1991 |
| JP | 04-083328 * | 3/1992 |
| JP | 04083328 A | 3/1992 |
| JP | 5-183597 | 8/1993 |
| JP | 07-326655 | 12/1995 |
| JP | 9323234 | 12/1997 |
| JP | 10-340896 | 12/1998 |
| JP | 10340896 | 12/1998 |
| JP | 2001117079 | 4/2001 |
| JP | 2001298013 | 10/2001 |
| JP | 2001-355072 A | 12/2001 |
| JP | 2002252276 | 9/2002 |
| JP | 2005-051200 | 2/2005 |
| KR | 2001-105389 | 11/2001 |
| KR | 2003-12050 | 2/2003 |
| KR | 2004-32489 | 4/2003 |
| TW | 541639 | 7/2003 |
| WO | WO 00/60658 | 10/2000 |
| WO | WO-01/71784 | 9/2001 |
| WO | WO-02/075790 | 9/2002 |

OTHER PUBLICATIONS

"Abrasive Grit Sizes" by Russ Rowlett, obtained from http:l/www.unc.edu/~rowlett/units/scales/grit.html on Apr. 30, 2005.*

Definition of "Corundum (emery)", Obtained from Hawley's Condensed Chemical Dictionary, 14$^{th}$ ed. At http://www.knovel.com on Apr. 30, 2005.

"Abrasive Grit Sizes" by Russ Rowlett, Obtained from http://www.unc.edu/-rowlett/units/scales/grit.html on Apr. 30, 2005.

First Office Action for Application No. 200410034739.0; Issued Aug. 11, 2008; People's Republic of China.

Second Office Action for Application No. 200410034739.0; Issued Jan. 12, 2007; People's Republic of China.

Chinese Third Office Action dated Apr. 27, 2007 for Chinese Application No. 200410034739.0.

European Office Action dated Feb. 15, 2007 for European Application No. 04011066.0-2119.

European Office Action dated Jul. 25, 2008 for European Application No. 04011066.0-2119.

European Office Action dated Nov. 21, 2007 for European Application No. 04011066.0-2119.

European Search Report dated Aug. 27, 2004 for European Application No. 04011066.0-2119.

Japanese Notice of Reasons for Rejection dated Jun. 17, 2008 for Japanese Application No. 2004-140365.

Korean Office Action dated Dec. 27, 2005 for Korean Application No. 200432489.

Korean Office Action dated Jul. 23, 2007 for Korean Application No. 20060070677.

Korean Office Action dated Nov. 10, 2006 for Korean Application No. 20060070677.

Taiwan Office Action dated Apr. 9, 2008 for Taiwan Application No. 093112801 with Taiwanese Search Report.

Taiwan Office Action dated Jul. 21, 2008 for Taiwan Application No. 95122556 with Taiwanese Search Report.

Taiwan Office Action dated Nov. 28, 2008 for Taiwan Application No. 093112801.

Japanese Office Action, Patent Application No. 2004-140365, dated Feb. 24, 2009.

Summary of Office Action dated Aug. 17, 2009 for Taiwan Patent Application No. 95122556.

Search Report dated Aug. 11, 2009 for Taiwan Patent Application No. 95122556.

First Office Action dated Nov. 20, 2009 for Chinese Patent Application No. 200610098582.7.

Notice of Rejection dated Aug. 23, 2011 for Japanese Patent Application No. 2009-149983.

Office Action dated Mar. 6, 2012 for Japanese Patent Application No. 10-2006-194506.

* cited by examiner

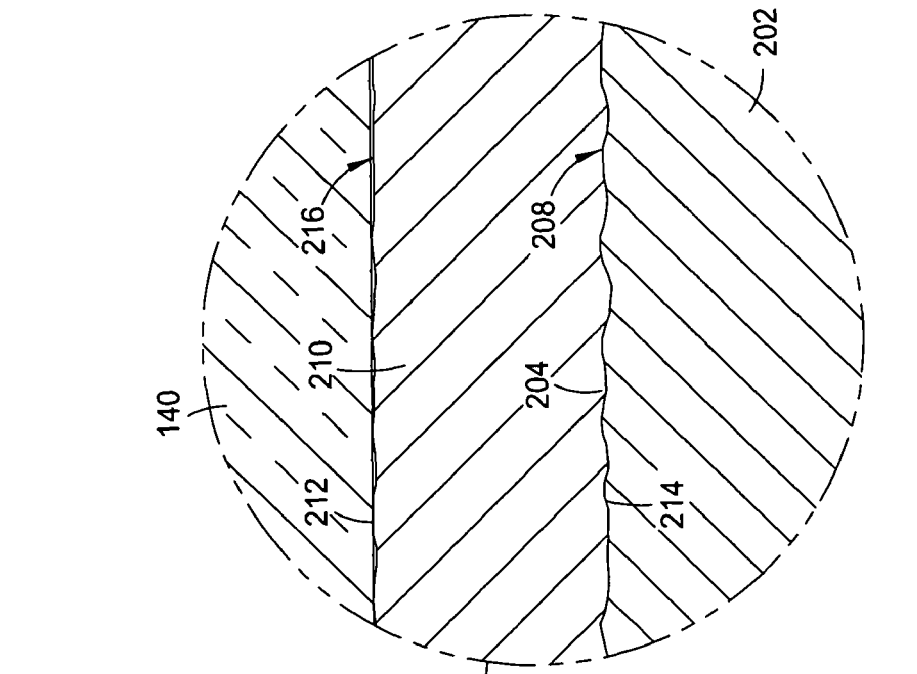
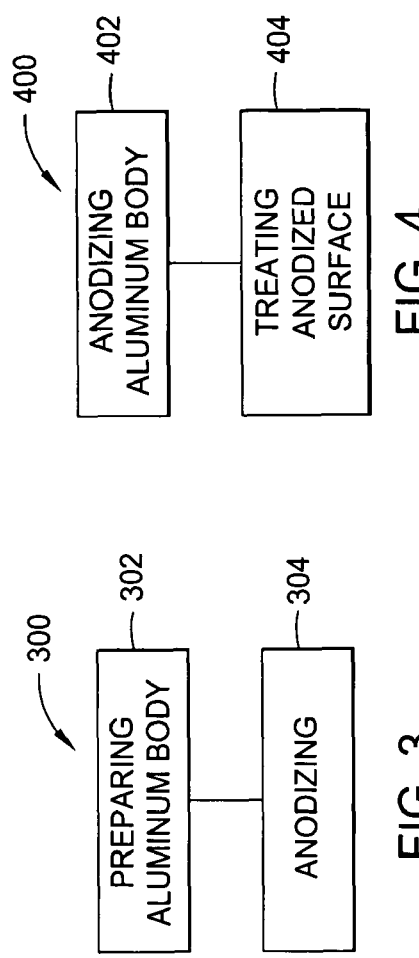
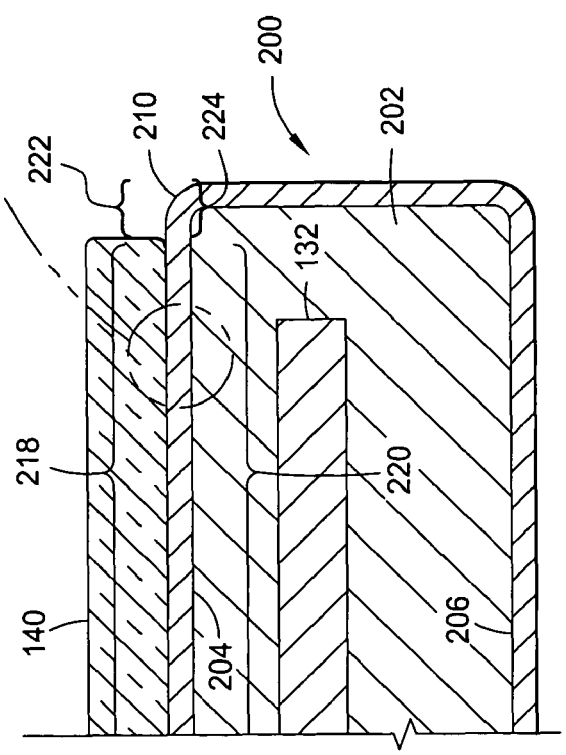

REDUCING ELECTROSTATIC CHARGE BY ROUGHENING THE SUSCEPTOR

CROSS-REFERENCE TO RELATED APPLICATIONS

This application is a continuation-in-part of U.S. patent application Ser. No. 10/435,182, filed May 9, 2003, now abandoned which is herein incorporated by reference.

BACKGROUND OF THE DISCLOSURE

1. Field of the Invention

Embodiments of the invention generally provide a substrate support utilized in semiconductor processing and a method of fabricating the same.

2. Description of the Background Art

Liquid crystal displays or flat panels are commonly used for active matrix displays such as computer and television monitors, personal digital assistants (PDAs), cell phones and the like. Generally, flat panels comprise two glass plates having a layer of liquid crystal material sandwiched therebetween. At least one of the glass plates includes at least one conductive film disposed thereon that is coupled to a power supply. Power supplied to the conductive film from the power supply changes the orientation of the crystal material, creating a pattern such as text or graphics seen on the display. One fabrication process frequently used to produce flat panels is plasma enhanced chemical vapor deposition (PECVD).

Plasma enhanced chemical vapor deposition is generally employed to deposit thin films on a substrate such as a flat panel or semiconductor wafer. Plasma enhanced chemical vapor deposition is generally accomplished by introducing a precursor gas into a vacuum chamber that contains a substrate. The precursor gas is typically directed through a distribution plate situated near the top of the chamber. The precursor gas in the chamber is energized (e.g., excited) into a plasma by applying RF power to the chamber from one or more RF sources coupled to the chamber. The excited gas reacts to form a layer of material on a surface of the substrate that is positioned on a temperature controlled substrate support. In applications where the substrate receives a layer of low temperature polysilicon, the substrate support may be heated in excess of 400 degrees Celsius. Volatile by-products produced during the reaction are pumped from the chamber through an exhaust system.

Generally, large area substrates utilized for flat panel fabrication are large, often exceeding 550 mm×650 mm, and are envisioned up to and beyond 4 square meters in surface area. Correspondingly, the substrate supports utilized to process large area substrates are proportionately large to accommodate the large surface area of the substrate. The substrate supports for high temperature use typically are casted, encapsulating one or more heating elements and thermocouples in an aluminum body. Due to the size of the substrate support, one or more reinforcing members are generally disposed within the substrate support to improve the substrate support's stiffness and performance at elevated operating temperatures (i.e., in excess of 350 degrees Celsius and approaching 500 degrees Celsius to minimize hydrogen content in some films). The aluminum substrate support is then anodized to provide a protective coating.

Although substrate supports configured in this manner have demonstrated good processing performance, small local variations in film thickness, often manifesting as spots of thinner film thickness, have been observed which may be detrimental to the next generation of devices formed on large area substrates. It is believed that variation is glass thickness and flatness, along with a smooth substrate support surface, typically about 50 micro-inches, creates a local capacitance variation in certain locations across the glass substrate, thereby creating local plasma non-uniformities that result on deposition variation, e.g., spots of thin deposited film thickness. Aging and modifying plasma conditioning of the substrate support has shown to mitigate thin spot formation, particularly when performed in conjunction with an extended chamber vacuum purge before transferring a substrate into the chamber for processing. However, the resultant expenditures of time and materials required by this method and its unfavorable effect on cost and throughput make obtaining a more effective solution desirable.

As substrates sizes have increased from sizes from about 370 mm×470 mm to about 1200 mm×1040 mm, or even 1800 mm×2200 mm, other new defect modes have become critical issues in the fabrication of the flat panel display devices. As the size of next generation of substrates continue to grow, the importance of defect reduction becomes increasingly important due to the substantial investment by the flat panel manufacturer in each substrate. Moreover, with the continual evolution of device critical dimension reduction demanding closer tolerances for film uniformity, the reduction and/or elimination of film thickness variation becomes an important factor for the economic production of the next generation devices formed on large area substrates.

Moreover, the effectiveness of a substrate fabrication process is often measured by two related and important factors, which are device yield and the cost of ownership (CoO). These factors are important since they directly affect the cost to produce an electronic device and thus a device manufacturer's competitiveness in the market place. The CoO, while affected by a number of factors, is greatly affected by the initial cost of the processing hardware and the replacement cost of consumable hardware. In an effort to reduce CoO, electronic device manufacturers often spend a large amount of time trying to optimize the processing hardware and consumable cost to achieve the greatest the highest profit margins without affecting the particle and process yield performance. Another important factor in the CoO calculation is the system reliability and system uptime. These factors are very important to a cluster tool's profitability and/or usefulness, since the longer the system is unable to process substrates the more money is lost by the user due to the lost opportunity to process substrates in the cluster tool. Therefore, cluster tool users and manufacturers spend a large amount of time trying to develop reliable processes, reliable hardware and reliable systems that have increased uptime.

One defect that has been found to be an issue in large area substrate PECVD type processes is a defect known in the industry as the electro-static discharge (ESD) metal line arcing problem. It is believed that as the substrate size increased the inductive current induced in the longer and larger ESD metal lines during plasma deposition is large enough to make the damage to the substrate from plasma induced arching a major recurring problem. This problem is generally not experienced in the smaller semiconductor device fabrication applications (e.g., 150 mm to 300 mm circular silicon substrates) since the gate-metal lines in flat panel display applications, which are connected to the ESD discharge line, are generally about 5 to 10 micrometers (μm) wide and can be about a meter or two meters long whereas in typical semiconductor application gate-metal lines are on the order of 90 nanometers size at most tens of millimeters long. The width of the ESD lines in the flat panel display substrates is typically greater than 1 mm in size and can be between about a meter or two meters long. It is believed that the ESD metal lines in flat panel display applications thus tend to act as an antenna that can collect an amount of charge during plasma processing that will cause arching damage to the substrate. Therefore, there is a greater need to reduce the chance of arcing due to the interaction with the plasma by increasing the resistance of the discharge path to ground. It should be noted that the thickness of the flat panel substrates (e.g., 0.7 mm), which is much larger than semiconductor substrates, has not changed dramatically from the large and smaller sized flat panel display type substrates.

Another defect that has arisen in the processing of 1200 mm×1040 mm, or larger substrates, is an increased in the number of particles found on the backside of the substrate after performing a plasma process on the substrate, such as a PECVD process. It is believed that as the glass substrate size increases the ability to trap static charge during plasma processing increases, thus causing particles found in the processing chamber to be attracted to the substrate surface where they are held by the trapped charge.

The issue of arcing and static charge is believed to be different in flat panel display applications versus semiconductor applications due to the size and properties of the different substrate materials. The static charge generated by the triboelectric process, or the process of bringing two materials into contact with each other and then separating them from each other, is influenced by a number of factors, two of which are the amount of surface contact between the two components and the work function of the two materials. One difference between flat panel and semiconductor applications is the difference in the properties of the substrate material(s) used in each of these applications (e.g., glass versus silicon (or germanium)), which is related to a material property known as its work function. In general, the work function describes a material's ability to hold onto its free electrons (the electrons orbiting the outer most shell of the material). In general, materials with larger work functions (e.g., silicon) are less likely to give up their electrons than a material that has a lower work function (e.g. glass) when they are placed in contact with a given material and then separated from the material. (See reference "Triboelectric Generation: Getting Charged" in EE-Evaluation Engineering, November, 2000 written by Ryne C. Allen.) Therefore, while the static charge generation issue is dependent on the materials which the processed substrate comes in contact with, the amount of charge and the polarity of the charge generated in a flat panel display substrate versus a semiconductor substrate will not be the same.

The second triboelectric factor, or the amount of contact between the parts, means that the greater the contact between the components the more charge that will be transferred between the contacting components and possibly arcing. The amount of surface roughness of the two components has a direct affect on the amount of contact between the two parts. Therefore, while some prior art application, such as U.S. Pat. No. 6,063,203 filed Jun. 2, 1998 suggest a process of roughening the surface of a susceptor (substrate support) to an $R_a$ of between 1 and 8 micrometers, the reference requires a final step of polishing the roughened susceptor surface which reduces the roughness and increase the contact between the two substrate components. The reduced roughness, and thus increased contact between the two substrate components, will increase the triboelectric charge transfer between the substrate and the substrate support, thus increasing the likelihood of generating enough trapped charge to form an arc or attract particles. An alternate theory is that the step of polishing a roughened surface, as described in the prior art, is thought to remove some of the benefits received from roughening the surface of the substrate support, such as an improved electrical contact between the two parts (i.e., susceptor surface and glass substrate). The improved electrical contact is believed to be created by the higher contact stress at the sharp tips or high points of the roughened surface, which is thought to reduce the charge buildup between the two parts during plasma processing, thus reducing the chance of arcing and particle attraction to the substrate surfaces.

Therefore, there is a need for an improved substrate support that resolves all of these issues raised above.

SUMMARY OF THE INVENTION

A substrate support and method for fabricating the same are provided. In one embodiment of the invention, a substrate support includes an electrically conductive body having a substrate support surface, an electrically insulative coating disposed on the body and at least a portion of the coating disposed over a center of the substrate supporting surface having a surface finish between about 200 to about 2000 micro-inches.

In one embodiment, a substrate support is adapted to support large area substrates comprising a body having a substrate support surface, a substrate support structure having one or more supports that are adapted to structurally support the body during processing and an electrically insulative coating disposed on the substrate support surface treated after deposition to a surface finish between about 200 to about 2000 micro-inches.

In another embodiment, a substrate support is fabricated by a process including the steps of providing an aluminum body suitable for supporting a large area substrate on a substrate support surface, and forming an anodized coating having a surface roughness of between about 330 to about 2000 micro-inches on the substrate support surface.

In yet another embodiment, a substrate support adapted to support large area substrates comprising an electrically conductive body having a substrate support surface, wherein the substrate support surface is bare aluminum and has a surface finish between about 140 to about 2000 micro-inches.

In yet another embodiment, a substrate support adapted to support large area substrates comprising a bare aluminum body having a substrate support surface treated to a surface finish of about 140 to about 1000 micro-inches; and a substrate support structure having one or more supports that are adapted to structurally support the aluminum body during processing.

BRIEF DESCRIPTION OF THE DRAWINGS

A more particular description of the invention, briefly summarized above, may be had by reference to the embodiments thereof that are illustrated in the appended drawings. It is to be noted, however, that the appended drawings illustrate only typical embodiments of this invention and are therefore not to be considered limiting of its scope, for the invention may admit to other equally effective embodiments.

FIG. 2 is a partial sectional view of another embodiment of a substrate support assembly;

FIG. 2A is a partial sectional view of another embodiment of a substrate support assembly;

FIG. 3 is a flow diagram of one embodiment of a method for fabricating a substrate support assembly;

FIG. 4 is a flow diagram of another embodiment of a method for fabricating a substrate support assembly;

To facilitate understanding, identical reference numerals have been used, where possible, to designate identical elements that are common to the figures.

DETAILED DESCRIPTION

The invention generally provides a large area substrate support and methods for fabricating the same. The invention is illustratively described below in reference to a plasma enhanced chemical vapor deposition system for processing large area substrates, such as a plasma enhanced chemical vapor deposition (PECVD) system, available from AKT, a division of Applied Materials, Inc., Santa Clara, Calif. In one embodiment, the processing chamber is adapted to process large area substrate that have a surface area of at least about 2000 cm$^2$. In another embodiment, the processing chamber is adapted to process substrates that have a surface area of at least about 6,716 cm$^2$ (e.g., 730 mm×920 mm). However, it should be understood that the invention has utility in other system configurations such as physical vapor deposition systems, ion implant systems, etch systems, other chemical vapor deposition systems and any other system in which processing a substrate on a substrate support is desired.

Figure 1:
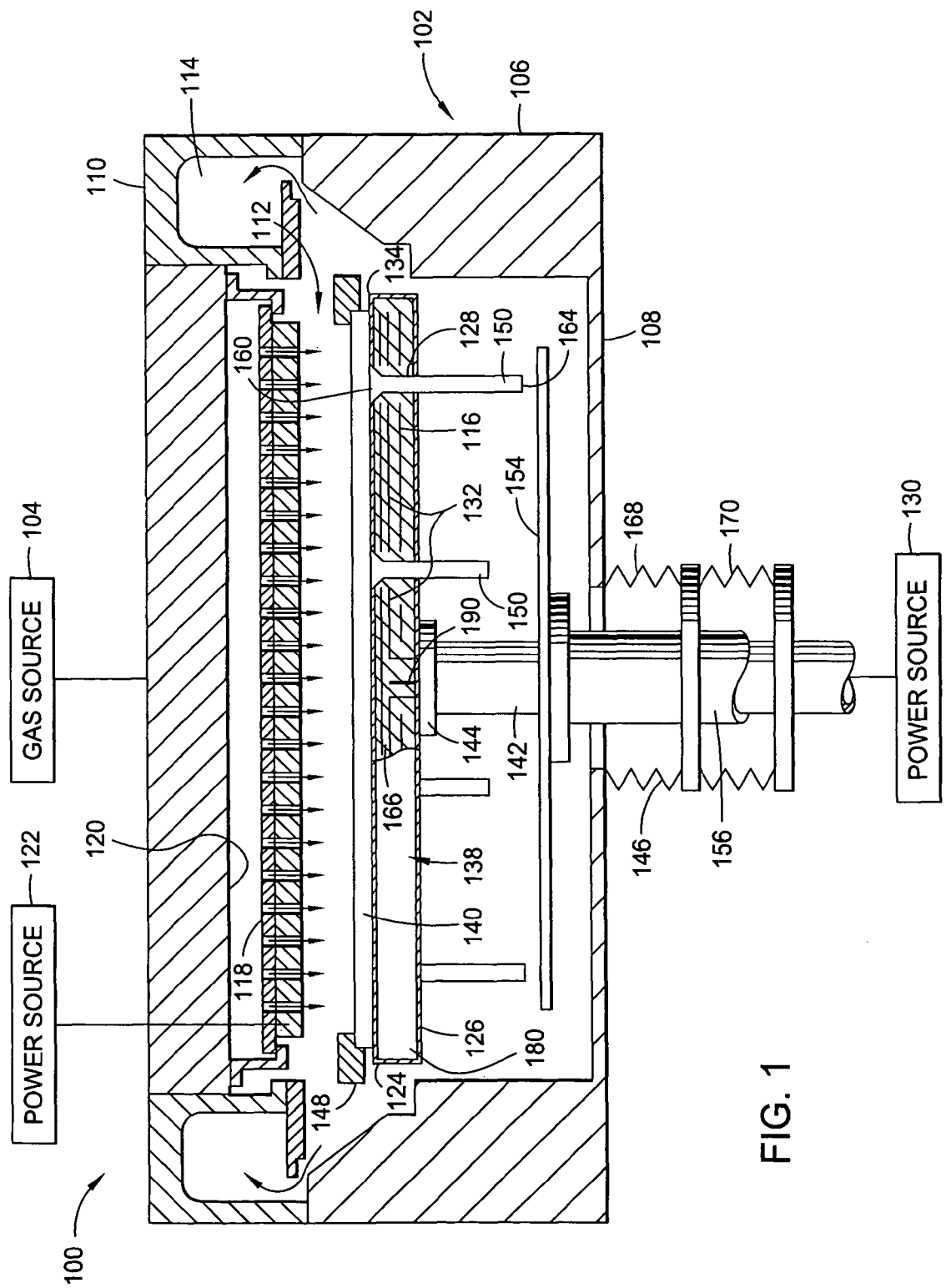
FIG. 1 depicts a schematic sectional view of one embodiment of a processing chamber having a substrate support assembly of the present invention.

FIG. 1 is a cross sectional view of one embodiment of a plasma enhanced chemical vapor deposition system 100. The system 100 generally includes a chamber 102 coupled to a gas source 104. The chamber 102 has walls 106, a bottom 108 and a lid assembly 110 that define a process volume 112. The process volume 112 is typically accessed through a port (not shown) in the walls 106 that facilitates movement of a large area glass substrate 140 into and out of the chamber 102. The walls 106 and bottom 108 are typically fabricated from a unitary block of aluminum or other material compatible for processing. The lid assembly 110 contains a pumping plenum 114 that couples the process volume 112 to an exhaust port (not shown) that is coupled to various pumping components (not shown).

The lid assembly 110 is supported by the walls 106 and can be removed to service the chamber 102. The lid assembly 110 is generally comprised of aluminum. A distribution plate 118 is coupled to an interior side 120 of the lid assembly 110. The distribution plate 118 is typically fabricated from aluminum. The center section includes a perforated area through which process and other gases supplied from the gas source 104 are delivered to the process volume 112. The perforated area of the distribution plate 118 is configured to provide uniform distribution of gases passing through the distribution plate 118 into the chamber 102.

A substrate support assembly 138 is centrally disposed within the chamber 102. The substrate support assembly 138 supports the large area glass substrate 140 (herein after "substrate 140") during processing.

Coated Susceptor Design

In one embodiment, the substrate support assembly 138 generally includes an electrically conductive body 124 that is covered with an electrically insulative coating 180 over at least the portion of the body 124 that supports the substrate 140. The electrically insulative coating 180 has a surface finish of about 200 to about 2000 micro-inches is believed to improve deposition uniformity without expensive aging or plasma treatment of the substrate support assembly 138. The surface finish is characterized by an average surface roughness (Ra) or Arithmetical Average (AA). The electrically insulative coating 180 may also cover other portions of the body 124. It is believed that the rougher surface offsets the effect of glass substrate thickness variation to provide a more uniform capacitance across the substrate, thereby enhancing plasma and deposition uniformity, and substantially eliminating the formation of thin spots in the deposited film.

Also, since it is believed that the reduced contact between the substrate and the electrically insulative coating 180 will reduce the charge transfer caused by the reduced amount of contacting surface area, or the increase roughness improves electrical contact which reduces the difference in charge between the two parts, the possibility of ESD metal line arcing and particle attraction to the surface of the substrate will be reduced.

The conductive body 124 may be fabricated from metals or other comparably electrically conductive materials. The electrically insulative coating 180 may be a dielectric material such as oxides, silicon nitride, silicon dioxide, aluminum dioxide, tantalum pentoxide, silicon carbide, polyimide, among others, which may be applied by various deposition or coating processes, including but not limited to, flame spraying, plasma spraying, high energy coating, chemical vapor deposition, spraying, adhesive film, sputtering and encapsulating.

In one embodiment, the substrate support assembly 138 includes an aluminum conductive body 124 that encapsulates at least one embedded heating element 132 and a thermocouple 190. At least a first reinforcing member 116 is generally embedded in the body 124 proximate the heating element 132. A second reinforcing member 166 may be disposed within the body 124 on the side of the heating element 132 opposite the first reinforcing member 116. The reinforcing members 116 and 166 may be comprised of metal, ceramic or other stiffening materials. In one embodiment, the reinforcing members 116 and 166 are comprised of aluminum oxide fibers. Alternatively, the reinforcing members 116 and 166 may be comprised of aluminum oxide fibers combined with aluminum oxide particles, silicon carbide fibers, silicon oxide fibers or similar materials. The reinforcing members 116 and 166 may include loose material or may be a pre-fabricated shape such as a plate. Alternatively, the reinforcing members 116 and 166 may comprise other shapes and geometry. Generally, the reinforcing members 116 and 166 have some porosity that allows aluminum to impregnate the members 116, 166 during a casting process described below.

The heating element 132, such as an electrode disposed in the substrate support assembly 138, is coupled to a power source 130 and controllably heats the substrate support assembly 138 and substrate 140 positioned thereon to a predetermined temperature. Typically, the heating element 132 maintains the substrate 140 at a uniform temperature of about 150 to at least about 460 degrees Celsius.

Generally, the substrate support assembly 138 has a lower side 126 and an upper side 134 that supports the substrate. The lower side 126 has a stem cover 144 coupled thereto. The stem cover 144 generally is an aluminum ring coupled to the substrate support assembly 138 that provides a mounting surface for the attachment of a stem 142 thereto.

Generally, the stem 142 extends from the stem cover 144 and couples the substrate support assembly 138 to a lift system (not shown) that moves the substrate support assembly 138 between an elevated position (as shown) and a lowered position. A bellows 146 provides a vacuum seal between the process volume 112 and the atmosphere outside the chamber 102 while facilitating the movement of the support assembly 138. The stem 142 additionally provides a conduit for electrical and thermocouple leads between the substrate support assembly 138 and other components of the system 100.

The substrate support assembly 138 generally is grounded such that RF power supplied by a power source 122 to the distribution plate 118 (or other electrode positioned within or near the lid assembly of the chamber) may excite the gases disposed in the process volume 112 between the substrate support assembly 138 and the distribution plate 118. The RF power from the power source 122 is generally selected commensurate with the size of the substrate to drive the chemical vapor deposition process.

The substrate support assembly 138 additionally supports a circumscribing shadow frame 148. Generally, the shadow frame 148 prevents deposition at the edge of the substrate 140 and substrate support assembly 138 so that the substrate does not stick to the support assembly 138.

The substrate support assembly 138 has a plurality of holes 128 disposed therethrough that accept a plurality of lift pins 150. The lift pins 150 are typically comprised of ceramic or anodized aluminum. Generally, the lift pins 150 have first ends 160 that are substantially flush with or slightly recessed from an upper side 134 of the substrate support assembly 138 when the lift pins 150 are in a normal position (i.e., retracted relative to the support assembly 138). The first ends 160 are generally flared to prevent the lift pins 150 from falling through the holes 128. Additionally, the lift pins 150 have a second end 164 that extends beyond the lower side 126 of the support assembly 138. The lift pins 150 may be actuated relative to the substrate support assembly 138 by a lift plate 154 to project from the upper side 134, thereby placing the substrate in a spaced-apart relation to the support assembly 138.

The lift plate 154 is disposed proximate the lower side 126 of the support surface. The lift plate 154 is connected to the actuator by a collar 156 that circumscribes a portion of the stem 142. The bellows 146 includes an upper portion 168 and a lower portion 170 that allow the stem 142 and collar 156 to move independently while maintaining the isolation of the process volume 112 from the environment outside the chamber 102. Generally, the lift plate 154 is actuated to cause the lift pins 150 to extend from the upper side 134 as the substrate support assembly 138 and the lift plate 154 move closer together relative to one another.

FIGS. 2 and 2A are a partial sectional view of one another embodiment of a substrate support assembly 138, this embodiment is labeled hereafter as support assembly 200 to avoid confusion. The support assembly 200 includes a body 202, which may be aluminum, is substantially covered with an anodized coating 210. The body 202 may be comprised of one or more coupled members or a unitary casted body having the heating element 132 embedded therein. Examples of substrate support assemblies that may be adapted to benefit from the invention are described in U.S. patent application Ser. No. 10/308,385 filed Dec. 2, 2002, and Ser. No. 09/921,104 filed Aug. 1, 2001, both of which are hereby incorporated by reference in there entireties.

The body 202 generally includes a substrate support surface 204 and an opposing mounting surface 206. The mounting surface 206 is coupled to the stem 142 (seen in FIG. 1). The anodized coating 210 covers at least the substrate support surface 204 of the body 202 and provides a separating layer between the substrate 140 and the substrate support surface 204.

Referring to FIG. 2A, the coating 210 includes an outer surface 212 and an inner surface 214. The inner surface 214 is generally disposed directly on the body 202. In one embodiment, the anodized coating has a thickness of between about 0.3 mils (7.6 micrometers) to about 2.16 mils (54.9 micrometers). Anodized coatings having a thickness falling outside of this range tend to either fail during temperature cycling or do not sufficiently reduce spotting in SiN, αSi and n+α-Si large area films formed by PECVD deposition.

Referring to FIGS. 2 and 2A, a portion 218 of the outer surface 212 positioned above the substrate support surface 204 has a geometry configured to support the substrate 140 thereon. The portion 218 of the outer surface 212 has a coated surface finish 216 of a predefined roughness that promotes uniform thickness of films deposited on the substrate 140. The coated surface finish 216 has a roughness of about 200 to about 2000 micro-inches. The coated surface finish 216 advantageously results in improved film thickness uniformity and particularly has been found to substantially eliminate local thickness non-uniformity (spots of thin deposition) without conditioning (e.g., aging) the substrate support. The elimination of substrate support conditioning conserves both time and materials normally consumed in a plasma aging process and eliminates vacuum purges between cycles, the elimination of which results in improved system throughput. In one embodiment, the coated surface finish 216 has a roughness of about 330 micro-inches.

The coated surface finish 216 of the anodized coating 210 may be achieved by treating at least a portion 220 of the outer substrate support surface 204 underlying the substrate 140 and/or by treating at least the anodized coating 210 that supports the substrate 140 (to obtain a pre-defined surface finish 208). The surface finish 208 of the substrate support surface 204 may be formed in a number of manners, including bead blasting, abrasive blasting, grinding, embossing, sanding, texturing, etching or other method for providing a pre-defined surface roughness. In one embodiment, the surface finish 208 of the substrate support surface 204 of the body 202 is about 200 to about 2000 micro-inches. In another embodiment, the surface finish 208 is about 330 micro-inches.

Optionally, a strip 224 of the substrate support surface 204 bounding the portion 220 positioned out from under the substrate 140 may be left untreated to minimize the fabrication costs. This results in a strip 222 of the anodized coating 210 above the untreated strip 224 that may have a finish different than the finish 216, but as the strip 222 is beyond the substrate 140, the surface finish of the strip 222 has no effect on film deposition uniformity. In one embodiment, the strip 222 of the anodized coating 210 has a smoother surface finish than the portion 218 of the anodized coating 210 it bounds.

FIG. 3 depicts one embodiment of a method 300 for fabricating the support assembly 138. The method begins at step 302 by preparing the substrate support surface 204 of the body 202. The preparing step 302 generally entails working or otherwise treating the substrate support surface 204 so that the surface finish 208 is between about 200 to about 2000 micro-inches. The surface finish 208 is characterized by an average surface roughness (Ra) or Arithmetical Average (AA). In one embodiment, the preparing step 302 may include bead blasting, abrasive blasting, grinding, embossing, sanding, texturing, etching or other method for providing a pre-defined surface roughness, for example, about 330 micro-inches. To achieve a surface roughness greater than 500 micro-inches to about 2000 micro-inches it is common to use milling, lathe cutting, knurling, flame cutting or other similar metal removal techniques.

In one embodiment of step 302, the substrate support surface 204 is flame, arc or plasma sprayed with a material, such as, for example, aluminum (Al), alumina ($Al_2O_3$), titanium (Ti), or stainless steel, to achieve a desired roughness in the range between about 200 and about 2000 micro-inches. In one aspect, the substrate support surface 204 is coated with an arc sprayed aluminum material to achieve a roughness of about 200 to about 2000 micro-inches.

In one embodiment, the substrate support surface 204 is bead blasted to a pre-determined surface finish. Bead blasting may include impacting the body 202 with a garnet, ceramic or glass bead.

In another embodiment, the bead is aluminum oxide, having an average diameter of about 125 to about 375 micron. The beads are provided through a nozzle having an exit velocity sufficient to produce a surface finish 208 of about 200 to about 2000 micro-inches.

After the completion of the preparing step 302, the body is anodized at step 304. The anodizing step 304 generally includes applying an anodized layer having a thickness between about 0.3 to about 2.16 mils. The resultant coated surface finish 216 on the outer surface 212 of the anodized coating 210 is about 200 to about 2000 micro-inches, and preferably between about 300 and about 1000 micro-inches, and more preferably between about 330 and about 500 micro-inches.

FIG. 4 depicts another embodiment of a method 400 of fabricating a support assembly 138. The method begins at step 402 by anodizing the body 202. At step 404, at least a portion 218 of the outer surface 212 of the anodized coating 210 is treated to provide a roughened coated surface finish 216. Alternatively, other portions of the outer surface 212 may be treated.

The treating step 404 may include bead blasting, abrasive blasting, milling, embossing, sanding, texturing, etching or other method for providing a pre-defined surface roughness. In one embodiment, the treating step 404 results in a surface finish of the outer surface of about between about 200 to about 2000 micro-inches, and preferably between about 300 and about 1000 micro-inches, and more preferably between about 330 and about 500 micro-inches.

Figure 5:
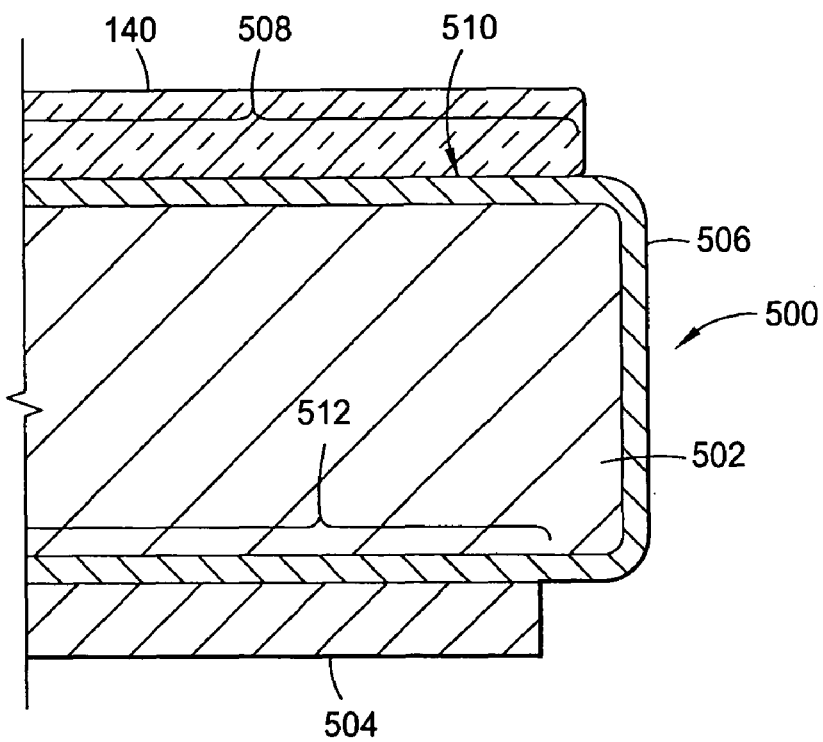
FIG. 5 is a partial sectional view of another embodiment of a substrate support assembly.

FIG. 5 depicts a partial sectional view of another embodiment of a support assembly 500 configured to enhance uniform deposition thickness. The support assembly 500 includes an aluminum support body 502 substantially encapsulated by an anodized coating 506. A heating element 504 is coupled to the support body 502 to control the temperature of the substrate 140 positioned on the upper surface of the support assembly 500. The heating element 504 may be a resistive heater or other temperature control device coupled to or disposed against the body 502. Alternatively, a lower portion 512 of the body 502 may be free from anodization to provide direct contact between the heating element 504 and the body 502. Optionally, an intervening layer (not shown) of thermally conductive material may be disposed between the heating element 504 and the lower portion 512 of the body 502.

An upper portion 508 of the anodized coating 506 that supports the substrate 140 has a surface finish 510 configured to enhance uniform deposition of films on the substrate 140. In one embodiment, the surface finish 510 has a roughness between about 200 to about 2000 micro-inches, and preferably between about 300 and about 1000 micro-inches, and more preferably between about 330 and about 500 micro-inches. The surface finish 510 may be created through a number of methods, including the methods described above.

Figure 6:
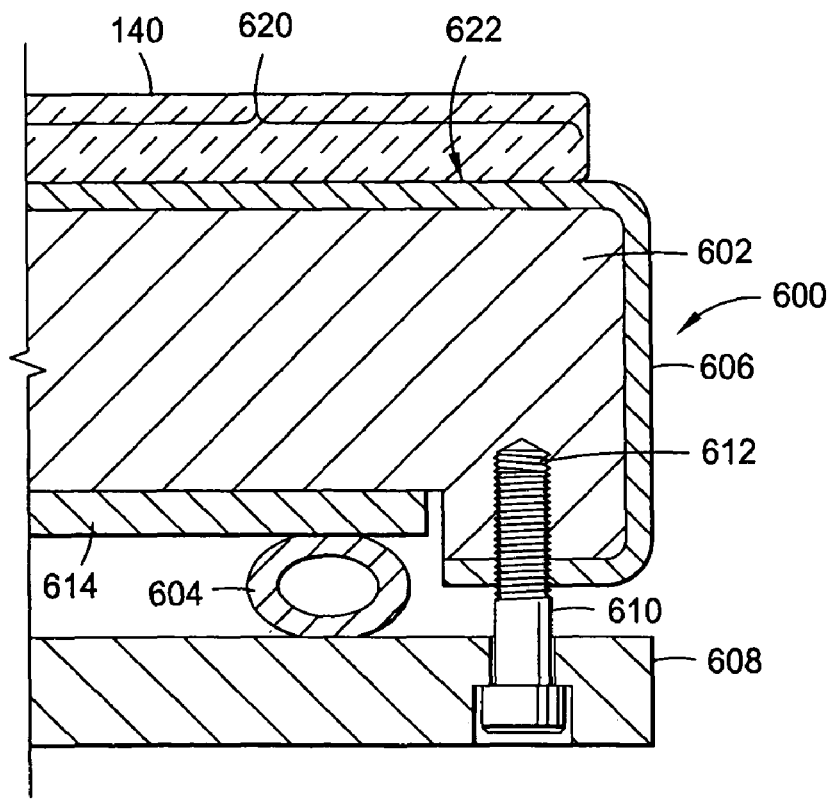
FIG. 6 is a partial sectional view of another embodiment of a substrate support assembly.

FIG. 6 depicts another embodiment of a heater assembly 600. The heater assembly 600 includes an aluminum body 602 having an anodized coating 606 at least partially formed thereon. A heating element 604, i.e., a conduit through which a temperature-controlled fluid is circulated, is disposed against a bottom surface of the body 602 to facilitate temperature control of the substrate 140. Optionally, a thermally conductive plate 614 may be disposed between the heating element 604 and the body 602 in order to enhance temperature uniformity between the heating element 604 and the body 602. In one embodiment, the thermally conductive plate 614 is a copper plate.

A clamp plate 608 is coupled to the body 602 by a plurality of fasteners 610 (one of which is shown in FIG. 6) that thread into a threaded hole 612 formed in the body 602. The clamp plate 608 sandwiches the heating element 604 with the body 602, thereby enhancing heat transfer.

A portion 620 of the anodized coating 606 that supports the substrate 140 has a surface finish 622 configured to enhance uniform deposition of films on the substrate 140. The surface finish 622 may be created similar to that described above.

Thus, a support assembly that enhances uniform deposition of films disposed on a large area substrate is provided. At least a portion of an anodized coating covering the aluminum body of the support assembly which supports the substrate is textured to a pre-determined surface roughness that enhances deposition uniformity, thereby substantially eliminating time-consuming aging of the support assembly and its associated costs.

Non Coated Susceptor

Figure 7A:
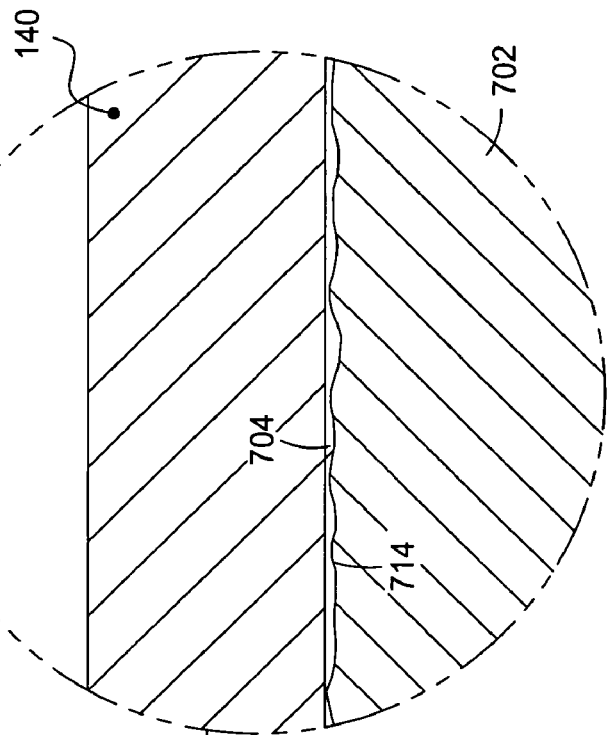
FIG. 7A is a partial sectional view of another embodiment of a substrate support assembly.
Figure 7:
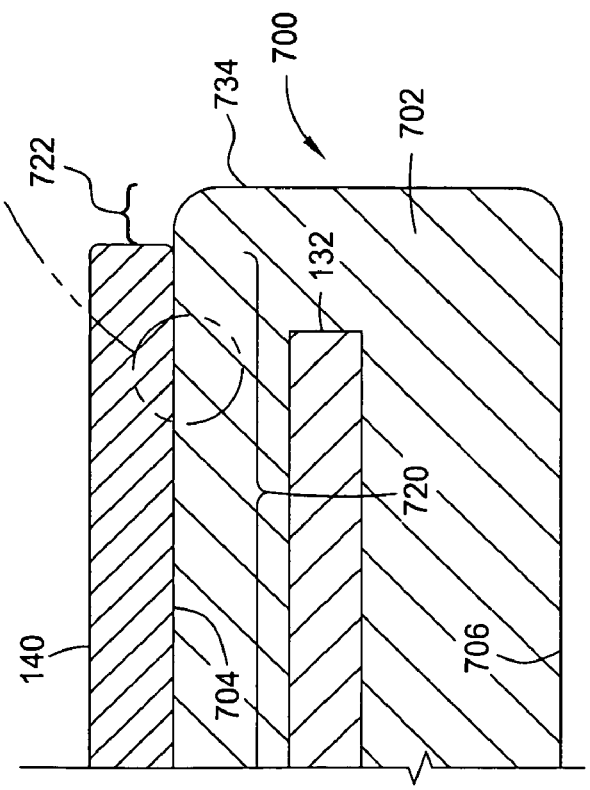
FIG. 7 is a partial sectional view of another embodiment of a substrate support assembly.

FIGS. 7 and 7A are a partial sectional view of one another embodiment of a substrate support assembly 138 that is uncoated, and will be labeled hereafter as substrate support assembly 700 to avoid confusion. The support assembly 700 includes a bare, or uncoated, body 702. The body 702 may be comprised of one or more coupled members or a unitary casted body having the heating element 132 embedded therein. In one embodiment, the body 702 is made from metal, such as, for example, aluminum (Al), titanium (Ti) or stainless steel.

The body 702 generally includes a substrate support surface 704 and an opposing mounting surface 706. The mounting surface 706 is coupled to the stem 142 (seen in FIG. 1).

Referring to FIGS. 7 and 7A, the substrate support surface 704 has a geometry configured to support the substrate 140 thereon. The substrate contact portion 720 of the substrate support surface 704 has a surface finish 714 of a predefined roughness that promotes uniform thickness of films deposited on the substrate 140. The surface finish 714 has a roughness of about 80 to about 2000 micro-inches. The surface finish 714 advantageously results in improved film thickness uniformity and particularly has been found to substantially eliminate local thickness non-uniformity (spots of thin deposition). In one embodiment, the surface finish 714 has a roughness greater than about 140 micro-inches. In another embodiment the surface finish 714 has a roughness greater than about 340 micro-inches. In one aspect, it may be desirable to leave the area 722 outside the substrate contact portion 720, side edge 734 and opposing mounting surface 706 in an unroughened or partially roughened state to reduce the cost of forming the substrate support assembly 700.

Figure 8:
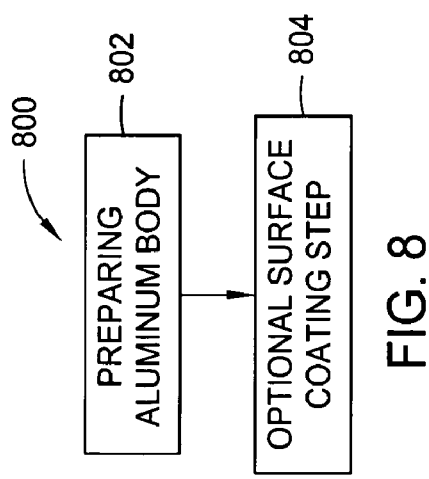
FIG. 8 is a flow diagram of one embodiment of a method for fabricating a substrate support assembly.

FIG. 8 depicts one embodiment of a method 800 for fabricating the support assembly 138. The method begins at step 802 by preparing the support surface 704 of the body 702. The preparing step 802 generally entails working or otherwise treating the support surface 704 so that the surface finish 714 is between about 140 to about 2000 micro-inches, and preferably between about 300 and about 1000 micro-inches, and more preferably between about 330 and about 500 micro-inches. The finish 714 is characterized by an average surface roughness (Ra) or Arithmetical Average (AA). In one embodiment, the preparing step 802 may include bead blasting, abrasive blasting, grinding, embossing, sanding, texturing, etching or other method for providing a pre-defined surface roughness, for example, about 330 micro-inches. To achieve a surface roughness greater than 500 micro-inches to about 2000 micro-inches it is common to use milling, lathe, knurling, flame cutting or other similar metal removal techniques.

In one embodiment, an optional surface coating step 804 is used to form a rough surface on which the substrate is supported. The surface coating step 804 may be performed on the support surface 704 by use of conventional flame, arc or plasma sprayed metals, such as, for example, aluminum (Al), titanium (Ti), or stainless steel, to achieve a desired roughness in the range between about 140 and about 2000 micro-inches. In one aspect, the support surface 704 of a body 702 which is made of aluminum is coated with an arc sprayed aluminum material to achieve a roughness greater than about 140 micro-inches.

In another embodiment of the optional step 804, a ceramic or metal oxide coating is deposited on the support surface 704 by use of a conventional flame, arc or plasma spray process to achieve a surface roughness between about 80 and 2000 micro-inches. For example an aluminum oxide ($Al_2O_3$) may be deposited on the support surface 704 to achieve a surface roughness between about 140 and about 2000 micro-inches.

Substrate Support Structure

Figure 9:
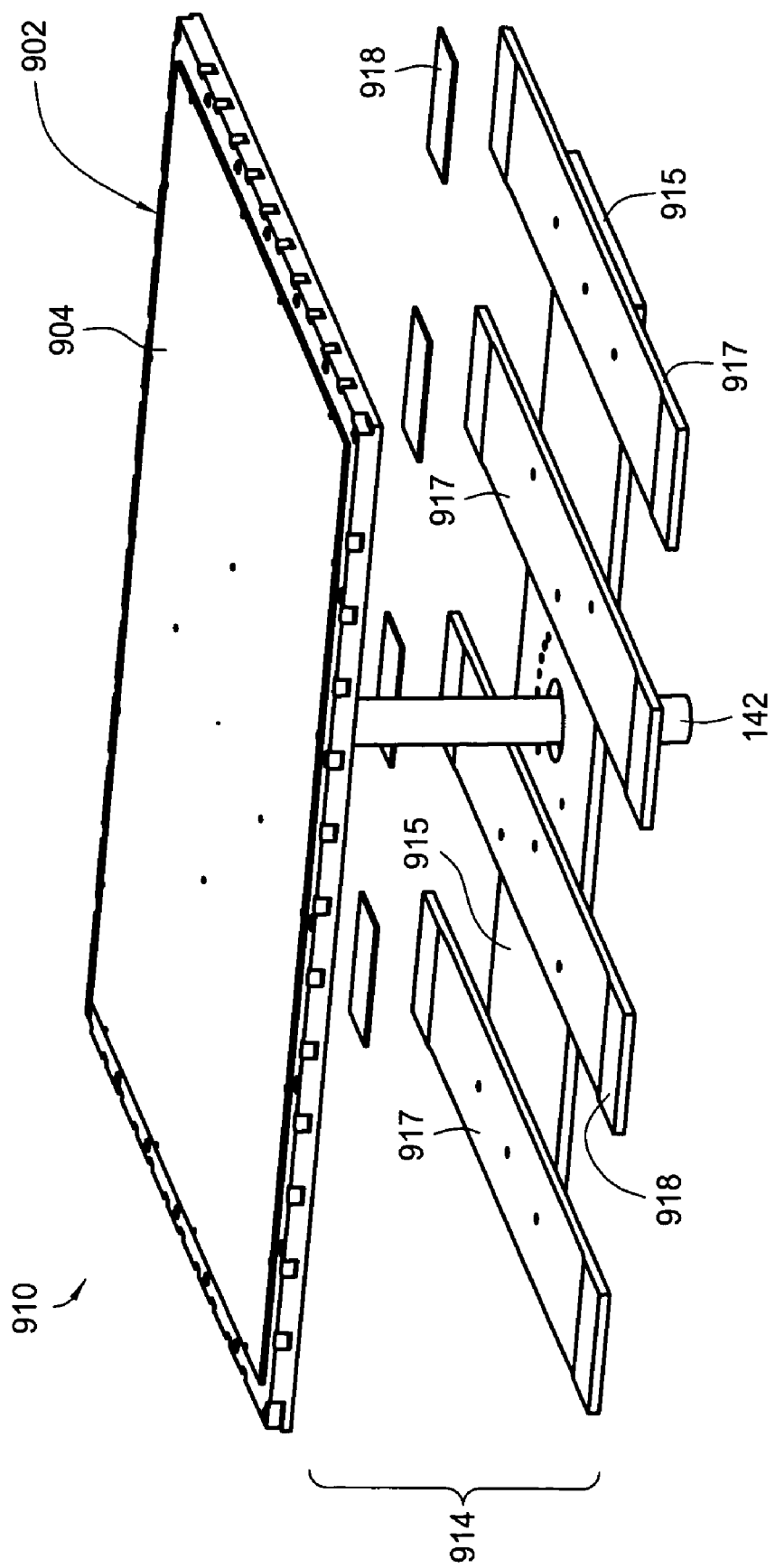
FIG. 9 is an exploded isometric view of a substrate support assembly, in one embodiment.
Figure 10:
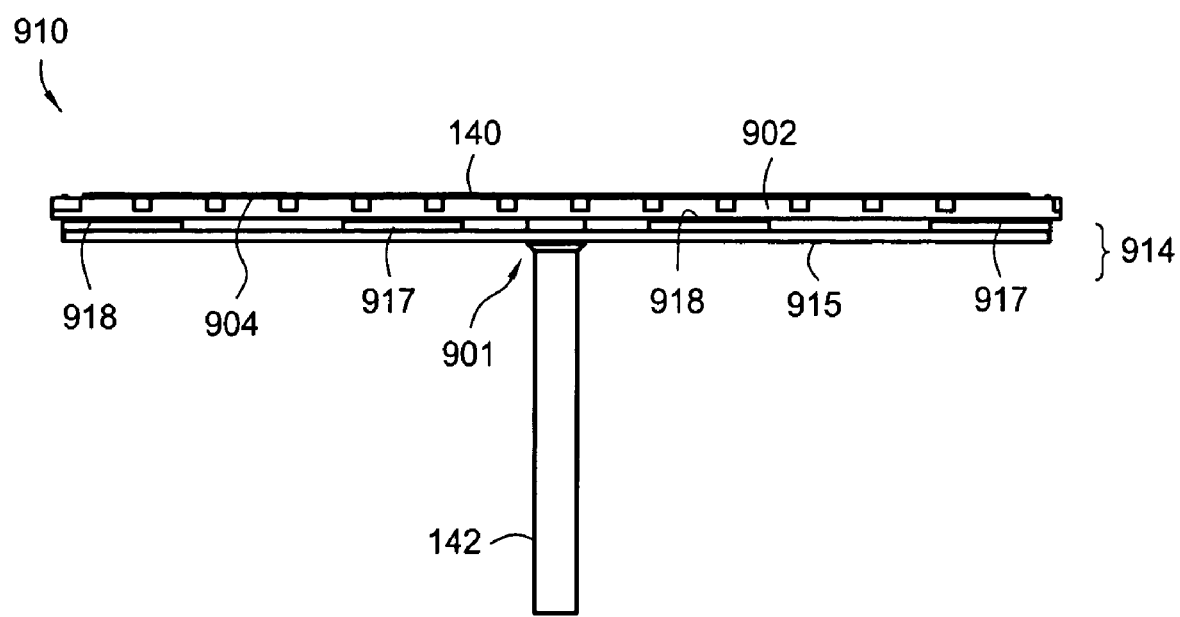
FIG. 10 is a side view of the substrate support assembly of FIG. 9.

The various aspects of the invention discussed above generally discuss various embodiments that can improve the substrate process results on large area substrates by improving the various properties or features of the substrate support assembly (e.g., elements 138, 200, 700). To achieve desirable and repeatable process results process results on large area substrates, one generally needs to assure that the contact between the substrate and the substrate support is relatively uniform and repeatable. To assure that the contact is relatively uniform and repeatable the substrate support surface generally needs to be formed into and remain in a desired and a repeatable shape. Referring to FIGS. 9 and 10, due to the size of the substrate support structure 910 and the temperatures commonly achieved during processing (e.g., typically 150° C. to 460° C.) one may often need to provide structural support (e.g., element 910) to the substrate support 902 to prevent it from deflecting due to gravity and softening of the material from which the substrate support 902 is formed. This issue commonly arises when using substrate supports 902 that are made of aluminum, due to the nature of the aluminum material at these temperatures. An exemplary design of a support structure that is internal to the substrate support 902 that is adapted to resist deflection during high temperature processing is further described in the commonly assigned U.S. Pat. No. 6,554,907, which is hereby incorporated by reference in its entirety to the extent not inconsistent with the claimed invention. An exemplary design of a support structure that is external to the substrate support 902 that is adapted to resist deflection during high temperature processing is further described in the commonly assigned U.S. patent application Ser. No. 11/143,506, filed Jun. 2, 2005, which claims the benefit of U.S. Provisional Patent Application Ser. No. 60/587,173, filed Jul. 12, 2004, which is hereby incorporated by reference in its entirety to the extent not inconsistent with the claimed invention.

FIG. 9 illustrates an explode isometric view of a substrate support structure 910 that may be used in place of the substrate support assembly 138 shown in FIG. 1. FIG. 10, illustrates a side view of the substrate support structure 910 in its fully assembled orientation that has a substrate 140 positioned on the substrate supporting surface 904. The substrate support structure 910 of FIGS. 9 and 10 generally includes a base structure 914 under the substrate support 902. In one aspect, the substrate support 902 is supported by the base structure 914 that is connected and supported by the shaft 142 at the connection point 901. In one embodiment, the base structure 914 is adapted to provide continual support to the substrate support 902 to assure that the substrate supporting surface 904 remains a desired predetermined shape before, during and after performing the various processes. The substrate support 902 described in conjunction with the support structure 910, generally can be formed by any of the processes described above (e.g., described in relation to elements 202, 502, 602, 702).

The base structure 914 generally contains elongated base support plate 915 and a plurality of lateral support plates 917 that are adapted to support the substrate support 902. In the configuration shown in FIG. 9 the lateral supports are disposed in an orientation that is generally transverse to the base support plate 915. In one aspect, it is preferred that the plates 915, 917 be fabricated from a material of sufficient strength and rigidity to support and retain the weight of the substrate support 902 under the processing temperature and pressure conditions. For example, the plates 915, 917 are made from a ceramic material, such as, alumina ($Al_2O_3$) or a heat resistant metal such as a 300 series stainless steel.

It is understood that the substrate support 902 rests immediately on the support plates 915, 917 although the view of FIG. 9 shows the substrate support structure 910 exploded for purposes of explanation. It is contemplated that the substrate support 902 and support plates 915, 917 do not move relative each other during processing. Also, referring to FIG. 9, while one base support plate 915 and four separate lateral support plates 917 are shown, it is to be understood that any number of support plates 915, 917 may be used.

In one embodiment, the base structure 914 may be formed in a non-planar shape in order to impart a non-planar profile to the substrate support 902 and the supported substrate 140 (see FIG. 10). In this embodiment, the base structure 914 may contain an elongated base support plate 915, a plurality of lateral support plates 917 disposed generally transverse to the base support plate 915, and a plurality of shims 918 of varying thicknesses that are placed on the lateral support plates 917 to support the substrate support 902 and achieve a desired non-planar profile. Preferably, the thickness of the shims 918 is from about 0.4 mm to about 3.5 mm. In this embodiment, the shims 918 are positioned at ends of the lateral support plates 917 however; the shims 918 may be located on other portions of the lateral support plates 917. It is contemplated that the shape of the support plates 917 and/or the use of shims 918 will allow pre-shaping of the substrate support 902 that will translate a desired planar orientation to a substrate during processing as the heated substrate will conform to the planar orientation of the substrate support 902 during processing.

Although several preferred embodiments which incorporate the teachings of the present invention have been shown and described in detail, those skilled in the art can readily devise many other varied embodiments that still incorporate these teachings.

We claim:

1. A substrate support adapted to support large area substrates comprising:
   an electrically conductive body having a substrate support surface;
   an electrically insulative coating disposed on the body; and
   at least a portion of the coating disposed over a center of the substrate supporting surface having a surface finish, $R_a$, between about 500 micro-inches and about 2000 micro-inches.

2. The substrate support of claim 1, wherein the electrically conductive body is at least partially fabricated from aluminum and the coating is an anodization layer.

3. The substrate support of claim 2, wherein the anodized coating has a thickness of about 0.3 to about 2.16 mils.

4. The substrate support of claim 1, wherein the substrate support surface has a surface finish between about 500 micro-inches and about 1000 micro-inches.

5. The substrate support of claim 1, wherein the electrically conductive body is encapsulated by the electrically insulating coating.

6. The substrate support of claim 1, wherein the coating disposed on the substrate support surface further comprises:
   a strip circumscribing the portion of the coating centered on the substrate support surface and having a surface finish less than about 200 micro-inches.

7. The substrate support of claim 1, wherein the substrate support surface further comprises:
   a center region having a surface finish, $R_a$, between about 500 micro-inches and about 1000 micro-inches; and
   a perimeter region circumscribing the center region and having a surface finish less than about 300 micro-inches.

8. The substrate support of claim 1, wherein the surface area of the substrate support surface is at least 2,000 cm$^2$.

9. A substrate support adapted to support large area substrates comprising:
   a body having a substrate support surface;
   a substrate support structure having one or more supports that are adapted to structurally support the body during processing; and
   an electrically insulative coating disposed on the substrate support surface treated after deposition to a surface finish, $R_a$, between about 500 micro-inches and about 2000 micro-inches.

10. The substrate support of claim 9, wherein the body is aluminum and the coating is an anodization layer.

11. The substrate support of claim 9, wherein the substrate support surface is treated by at least one of bead blasting, abrasive blasting, grinding, embossing, sanding, texturing, etching, milling, lathe cutting, knurling, or flame cutting.

12. The substrate support of claim 9, wherein the substrate support surface is blasted with aluminum oxide media having an average diameter of about 125 to about 375 microns.

13. A substrate support fabricated by a process comprising:
   providing a conductive body having a substrate support surface that is adapted to support a large area substrate; and
   coating the substrate support surface, wherein the coating has a surface roughness, $R_a$, between about 500 and about 1000 micro-inches.

14. The substrate support of claim 13, wherein the coating is an anodized coating that is formed on a conductive body that contains aluminum.

15. The substrate support of claim 13, wherein the step of providing a conductive body assembly further comprises:
   providing a substrate support structure having one or more supports; and
   positioning the conductive body on the one or more supports.

16. The substrate support of claim 13 further comprising:
   treating the substrate support surface before coating to yield a surface finish of about 300 to about 2000 micro-inches on the body.

17. The substrate support of claim 16, wherein the step of treating the substrate support surface further comprises:
   performing at least one treatment selected from a group consisting of bead blasting, abrasive blasting, grinding, embossing, sanding, texturing, etching, milling, lathe cutting, knurling, or flame cutting.

18. The substrate support of claim 16, wherein the step of treating the substrate support surface further comprises:
   bead blasting the substrate support surface, wherein bead blasting includes impacting the substrate support surface with beads having an average diameter of about 125 to about 375 microns.

19. The substrate support of claim 13, further comprising:
   encapsulating a heating element in the conductive body, wherein the conductive body contains aluminum.

20. The substrate support of claim 13, further comprising:
   coupling a heating element to the conductive body opposite the substrate support surface.

21. A substrate support fabricated by the process comprising:
   treating an aluminum substrate support surface adapted to support a large area substrate to obtain a surface finish, $R_a$, of about 500 to about 2000 micro-inches; and
   anodizing the substrate support surface to a thickness of about 0.3 to about 2.16 mils, wherein the surface finish of the anodized coating disposed at least over the center portion of the substrate support surface has a surface finish of between about 500 micro-inches and about 2000 micro-inches.

22. A substrate support adapted to support large area substrates comprising:
   an electrically conductive body having a substrate support surface, wherein the substrate support surface is bare aluminum and has a surface finish, $R_a$, between about 500 micro-inches and about 2000 micro-inches.

23. A substrate support adapted to support large area substrates comprising:
   an bare aluminum body having a substrate support surface treated to a surface finish, $R_a$, of about 500 micro-inches to about 1000 micro-inches; and
   a substrate support structure having one or more supports that are adapted to structurally support the aluminum body during processing.

24. The substrate support of claim 23, wherein the substrate support surface is treated by a process selected from a group consisting of bead blasting, abrasive blasting, grinding, embossing, sanding, texturing, etching, milling, lathe cutting, knurling, or flame cutting.

25. The substrate support of claim 23, wherein the substrate support surface is blasted with aluminum oxide media having an average diameter of about 125 to about 375 microns.

* * * * *